United States Patent [19]

Ishizuka et al.

[11] Patent Number: 5,000,689
[45] Date of Patent: Mar. 19, 1991

[54] CONNECTOR FOR INTEGRATED CIRCUIT PACKAGES

[75] Inventors: Shinichi Ishizuka; Tetsuro Tokaichi; Yoshikatsu Okada, all of Tokyo, Japan

[73] Assignees: Japan Aviation Electronics Industry, Ltd.; NEC Corporation, both of Tokyo, Japan

[21] Appl. No.: 471,949

[22] Filed: Jan. 29, 1990

[30] Foreign Application Priority Data

Jan. 30, 1989 [JP] Japan .................................. 1-8317[U]

[51] Int. Cl.$^5$ ............................................. H01R 9/09
[52] U.S. Cl. ..................................... 439/73; 439/341; 439/526
[58] Field of Search .................... 439/70, 73, 341, 526

[56] References Cited

U.S. PATENT DOCUMENTS

| | | | |
|---|---|---|---|
| 4,331,373 | 5/1982 | Demnianiuk | 439/526 |
| 4,515,425 | 5/1985 | Nakano | 439/73 |
| 4,713,022 | 12/1987 | Pfaff | 439/526 |
| 4,715,835 | 12/1987 | Matsuoka | 439/526 |
| 4,826,440 | 5/1989 | Plocek et al. | 439/70 |
| 4,846,703 | 7/1989 | Matsuoka et al. | 439/73 |
| 4,954,083 | 9/1990 | Fujizaki et al. | 439/73 |

*Primary Examiner*—Paula A. Bradley
*Attorney, Agent, or Firm*—Bierman and Muserlian

[57] ABSTRACT

Disclosed is a connector for integrated circuit packages. The connector generally includes a cover assembly having a metal framework for fixedly securing the integrated circuit package without projecting pin elements of the package from the backside of the cover assembly in order to prevent the pin element from the damage and a socket assembly for mounting contact elements to connect with the pin elements. The framework is hinged to the cover assembly at one of the side edges thereof. The cover assembly can be combined with the socket assembly by means of the first engage portion of the cover assembly and the second engage portion of the socket assembly at the side edge opposed to the hinged side edge. After combination the hinged side edge of the cover assembly can be pressed against the socket assembly so as to connect the pin elements with the corresponding contact elements from the side edge having the engage portion towards the hinged side edge of the socket assembly one by one.

3 Claims, 5 Drawing Sheets

CONNECTOR FOR INTEGRATED CIRCUIT PACKAGES

BACKGROUND OF THE INVENTION

1. Field of the Invention

This invention relates to electrical connectors and more particularly to a connector for integrated circuit packages.

2. Description of the Prior Art:

A semiconductor integrated circuit is formed from a base of semiconductor material and active devices or components such as transistors and passive components mounted on the base. A plurality of pin contact elements are used for connecting the components on the base with conductors arranged in a printed circuit board by means of a connector. The number of the pin contact elements will increase proportionally to the number of components. To minimize the scale of the package, a hundred of pin contact elements are arranged in the backside of the base thereof in the form of grid. This type of the package is commonly called as "Pin Grid Array type IC or PGA type IC".

In order to increase the number of the pin contact elements to be mounted on the substrate or base of the package, it is necessary to reduce the physical size or dimension of the pin contact element. It will bring results that the pin connector element is not strong enough for connecting with the contact element of the connector.

In view of the foregoing, the need exists for a new and improved connector for a PGA type integrated circuit package which overcomes some of the problems of the prior art.

SUMMARY OF THE INVENTION

In accordance with the present invention, a new and improved connector for the PGA type integrated circuit packages is disclosed which can be configured to insert pin contact elements in the integrated circuit package into the respective contact elements of a socket assembly without applying a specific force thereto.

According to the present invention, a plurality of pin contact elements can be connected with the corresponding contact elements of the socket assembly in the order in which they are arranged in a row.

Consequently, it is an object of the present invention to provide a new and useful connector for PGA type integrated circuit packages.

The above and further objects and novel features of the invention will more fully appear from the following detailed description when the same is read in connection with the accompanying drawings. It is to be expressly understood, however, that the drawing is for purpose of illustration only and is not intended as a definition of the limits of the invention.

DETAILED DESCRIPTION OF THE PREFERRED EMBODIMENT

Figure 1:
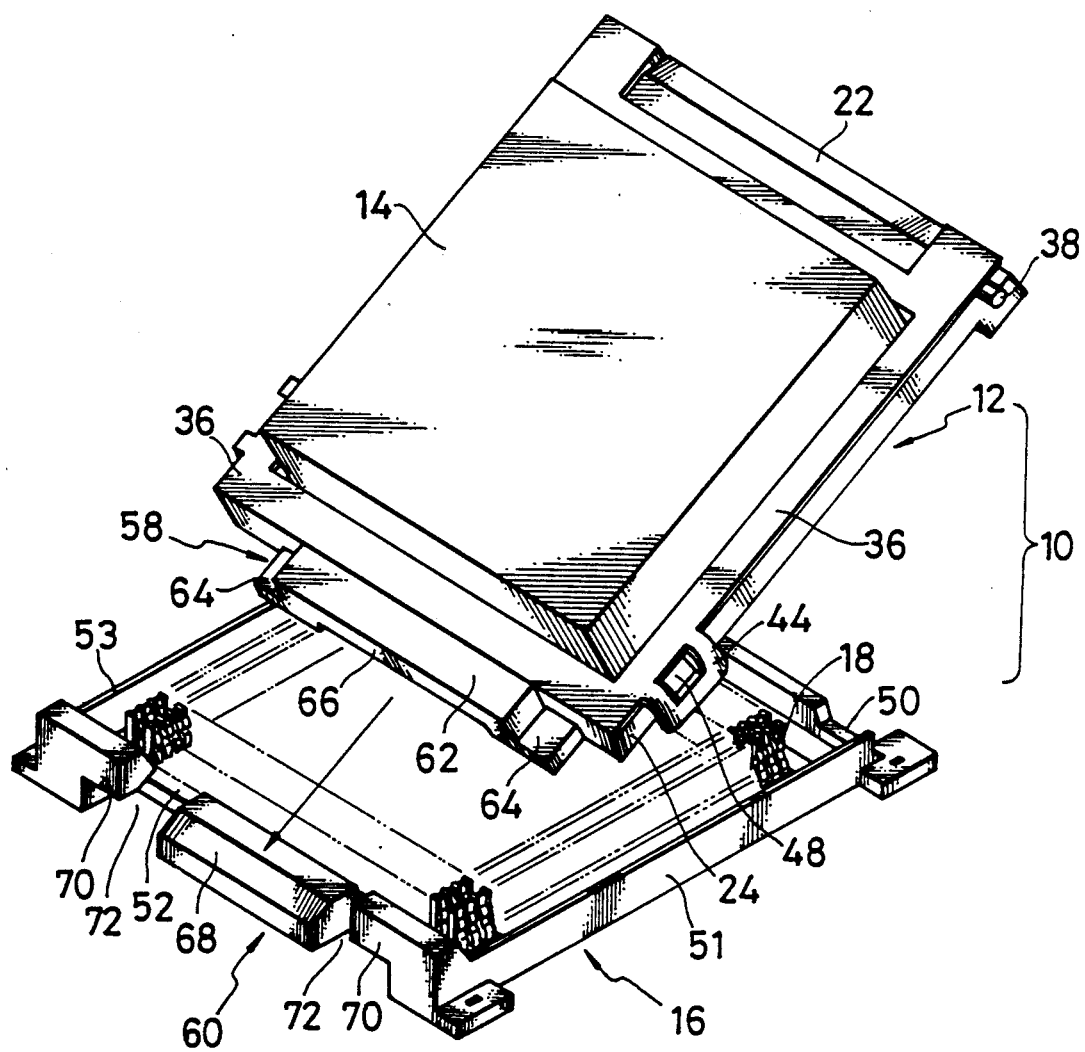
FIG. 1 is an exploded perspective view of the connector of the present invention.
Figure 8:
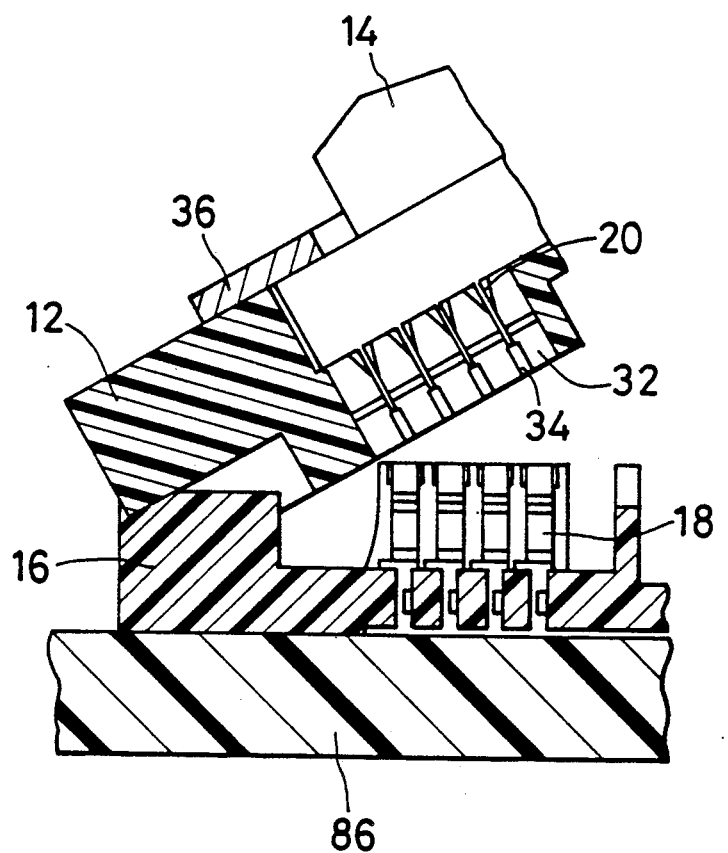
FIG. 8 is an enlarged sectional view illustrating the socket assembly and the connector taken along line VIII—VIII of FIG. 5.

Referring now more particularly to the drawings, FIG. 1 shows a connector 10 of the present invention as including a cover assembly 12 for mounting a PAG type integrated circuit package 14 and a socket assembly 16 which has a plurality of contact elements 18. The integrated circuit package 14 has a plurality of terminal pins 20 (FIG. 8) arranged in one or more lines.

Figure 2:
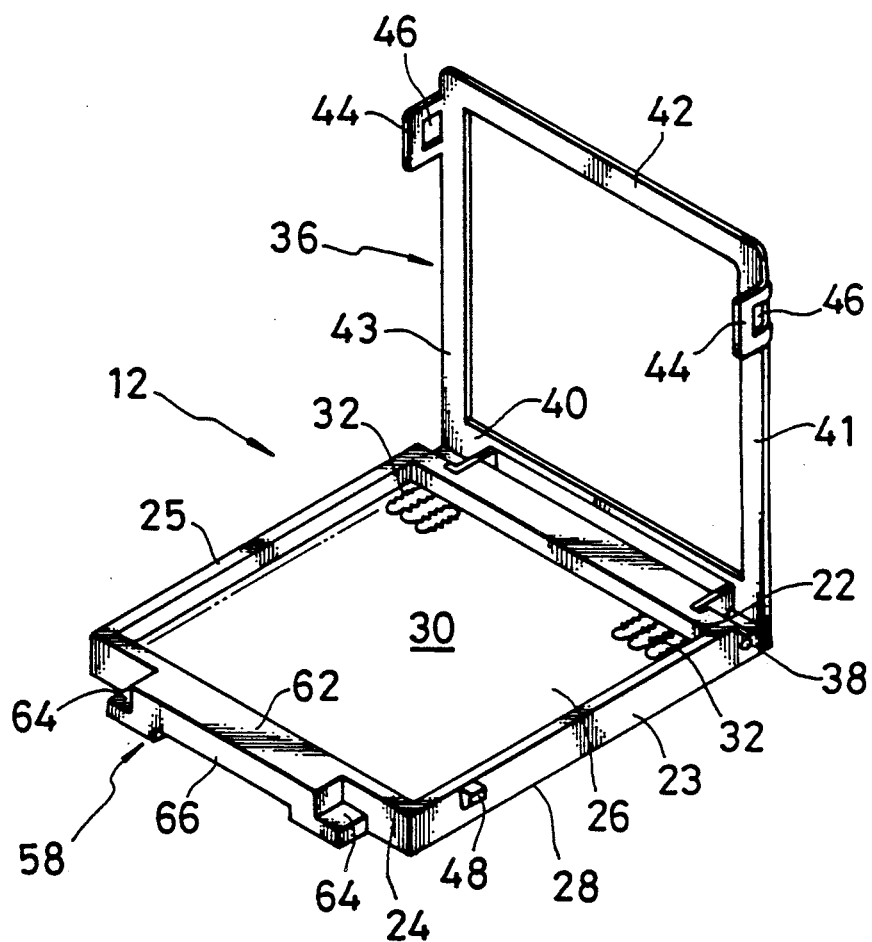
FIG. 2 is a schematic perspective view of a cover assembly of the connector of the present invention.
Figure 3:
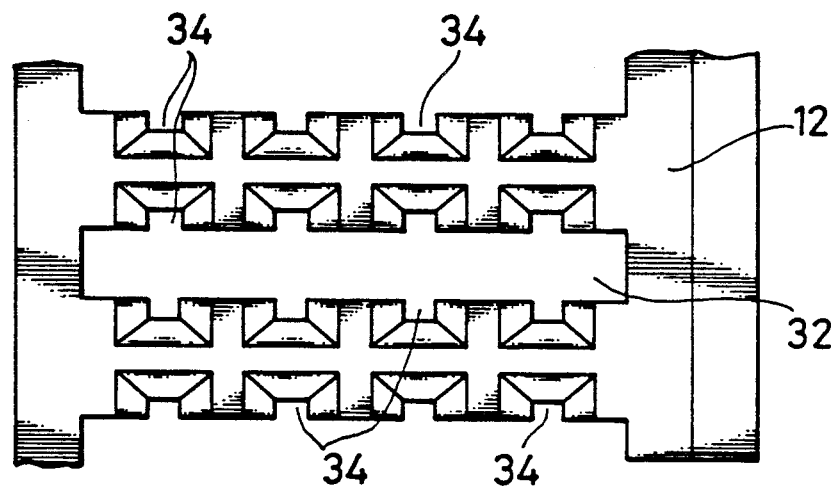
FIG. 3 is an enlarged fragmentary sectional view of one of grooves in the cover assembly of the present invention.

As shown in FIG. 2, the cover assembly 12 is of a square configuration having side edges 22, 23, 24 and 25 and having an upper planar surface 26 and a lower planar surface 28. The upper planar surface 26 is provided with a square hollow space 30 for mounting the integrated circuit package 14 therein. In the lower planar surface 28, there are provided with a plurality of narrow grooves 32 extending along the side edge 23 or 25. In each of the grooves 32 the terminal pins 20 extending from the bottom of the package 14 and the contact elements 18 are received. Two lines of the terminal pins 20 adjacent to each other are inserted into each line of the grooves 32. To this end, in both side walls of the groove 32, there are notches or cuts 26 for guiding the respective terminal pins 20.

In order to secure fixedly the integrated circuit package 14 to the hollow space 30 in the cover assembly 12, a square metal framework 36 is mounted by means of a hinge 38 to the cover assembly 12. The framework 36 has side edges 40, 41, 42 and 43 and the width of each of the side edges 40, 41, 42 and 43 is wider than that of the corresponding side edges 22, 23, 24 and 25 of the cover assembly 12.

Each of the side edges 41 and 43 is provided with a lock member 44 with an opening or window 46 into which a corresponding ear 48 of each of the side edges 23 and 25 of the cover assembly 12 can be inserted so as to hold the cover assembly 12 and the framework 36 in closed position.

Figure 4:
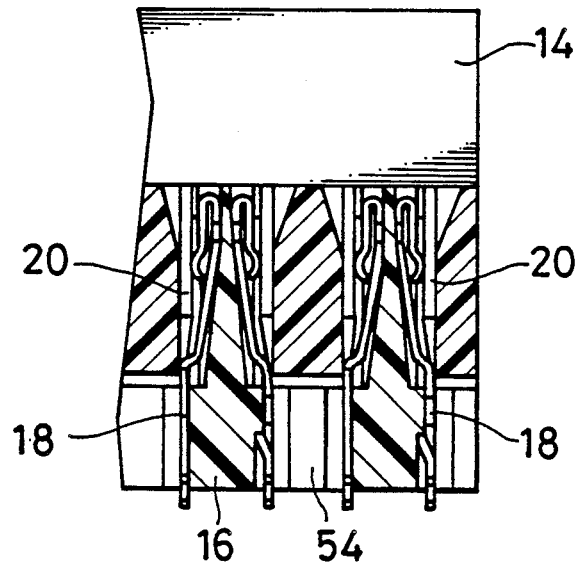
FIG. 4 is a fragmentary sectional view illustrating the connection of the pin contact element of the package with the contact element of the socket assembly.

The socket assembly 16 is formed of suitable dielectric material as the same as the material of the cover assembly 12 and substantially square structure having side edges 50, 51, 52 and 53. As shown in FIG. 4, the socket assembly 16 has a plurality of openings 54 which are arranged in the form of grid so as to align with the corresponding terminal pins 20 of the package 14. The side wall between the adjacent openings 54 is upwardly extended to form a dielectric protruding portion 56 which can be received in the narrow groove 32.

The cover assembly 12 carrying the package 14 can be laid on the socket assembly 16 and combined therewith. In order to combine the cover assembly 12 with the socket assembly 16, the side edge 24 of the cover assembly 12 is provided with a first engage portion 58 and the corresponding side edge 52 of the socket assembly 16 is provided with a second engaging portion 60 which can cooperate with the first engage portion 58.

As shown in FIG. 1, the first engage portion 58 is formed from a central member 62 projected outwardly from the side edge 24 and the upper surface of the member 62 is the same level as one of the side edge 24. The both ends of the central member 62 are respectively terminated by the leg 64. The upper surface of the leg 64 is stepped down from the upper surface of the central member 62 and the lower surface of the leg 64 is the same as one of the side edge 24. The under side of the central member 62 is provided between the legs 64 with a hollow space 66.

The second engage portion 60 is formed from a central member 68 which can be received in the hollow space 66 in the first engaging portion 58 and a pair of arms 70 and there is a space 72 between the inner end of the arm 70 and the outer end of the central member 68 so as to insert the leg 64 of the first engage portion 58 so as to insert the leg 64 of the first engage portion 58 in the space 72.

Figure 5:
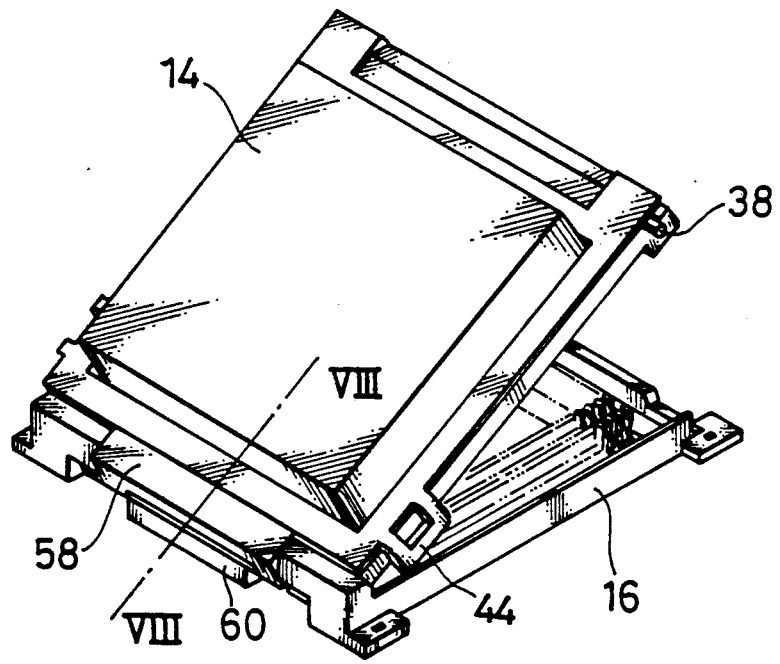
FIG. 5 is a schematic perspective view illustrating the connection of the cover assembly with the socket.

If the first engage portion 58 and the second engage portion 60 are combined as shown in FIG. 5, the cover assembly 12 will be mounted on the socket assembly 16 at a desired angle such as for example about 30 degrees according to the dielectric protruding portions 56.

Figure 6:
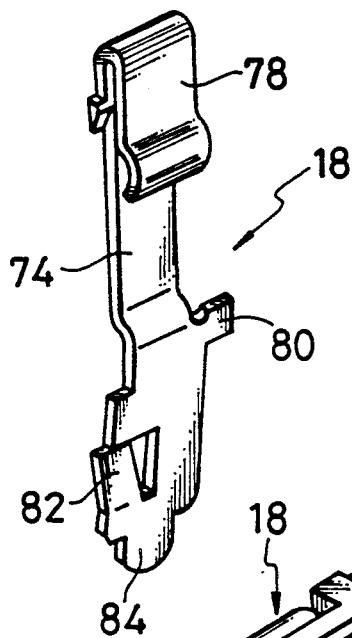
FIG. 6 is an enlarged perspective view of the contact element of the present invention.
Figure 7:
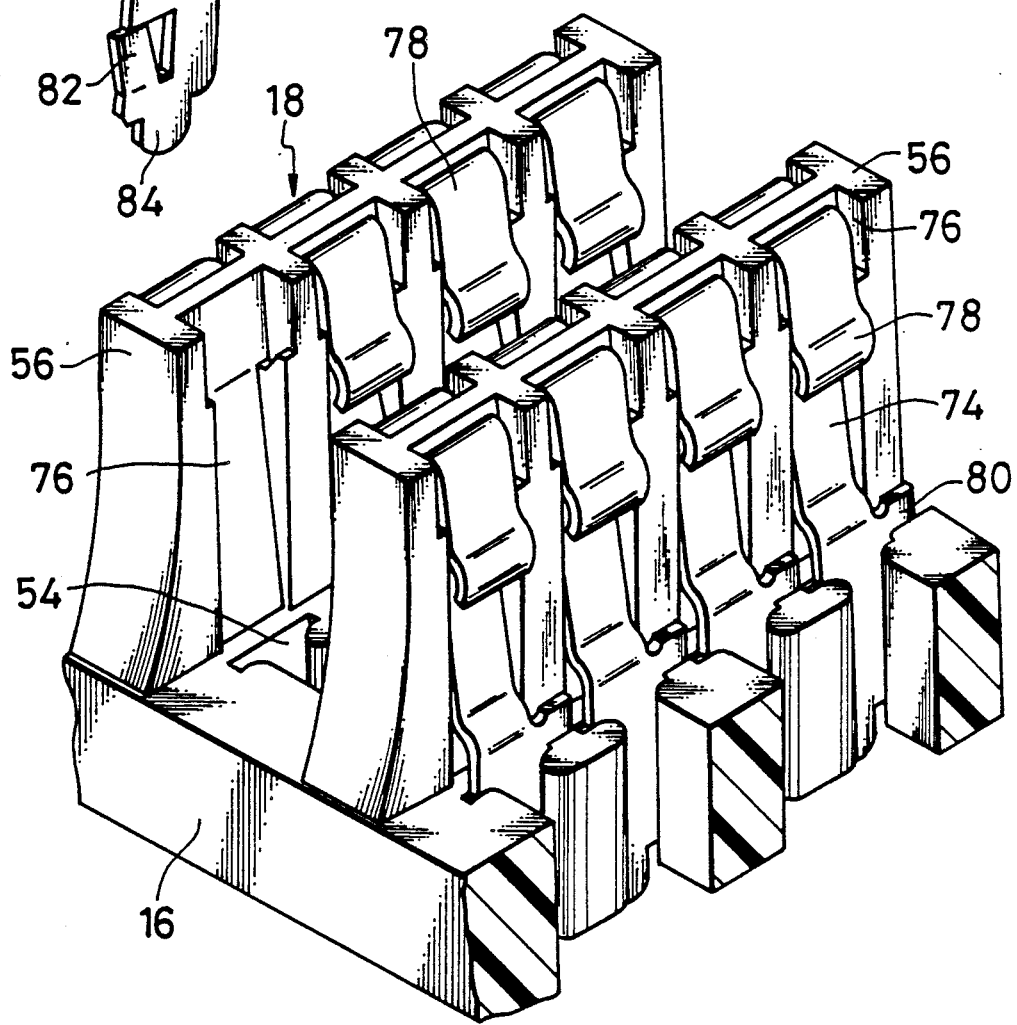
FIG. 7 is a partial perspective view illustrating the relationship between the socket and the contact element of the present invention.

As stated above, the contact elements 18 are arranged to the socket assembly 16 so as to contact with the respective terminal pins 20 of the package 14 mounted on the cover assembly 12. As shown in FIG. 6, the contact element 18 may be punched from a sheet metal and includes a stem 74 which can be received in a groove 76 which is formed in both sides of the dielectric protruding portion 56. The head of the contact element 18 is formed with a spring contact portion 78. The contact element 18 is provided with protrusions 80 and 82 on the stem 74 which serve as anchors to prevent the contact element 18 from being pulled out of the groove 76 in the socket assembly 16. The tail end 84 of the contact element 18 can be fixed to the conductor (no shown) on a printed circuit board 86 by welding.

According to the present invention, when the integrated circuit package 14 is mounted in the square hollow space 30 in the cover assembly 12, each of the terminal pins 20 of the package 14 can be inserted into the corresponding notches or cuts 34 in each of the narrow grooves 32 in the cover assembly 12.

When the metal framework 36 is closed and each of the lock members 44 are respectively engaged with the corresponding ears 48 of the cover assembly 12 to fixedly secure the package 14 to the cover assembly 12. And as stated above, each of the contacts 18 is mounted in the groove 76 in the dierectric protruding portion 56 of the socket assembly 16, then the second engage portion 60 of the socket assembly 16 and the first engage portion 58 of the cover assembly 12 are combined each other, and the side edge 22 of the cover assembly 12 is pressed against the side edge 50 of the socket assembly 16. Thus, each of the narrow grooves 32 in the cover assembly 12 receives the each of the corresponding dielectric protruding portions 56 of the socket assembly 16 from the side edge 52 towards the side edge 50. Consequently, each of the terminal pins 20 arranged in the notch of the cover assembly 12 can be contacted with each of the corresponding contact elements 18 in the groove 76. Thus, the integrated circuit package 14 mounted on the cover assembly 12 can be completely combined with the socket assembly 16, and it is possible to connect the tail end 84 of the contact element 18 with the desired conductor on the printed circuit board 86 by welding.

As clear from the foregoing, if the package 14 is mounted on the cover assembly 12, each of the terminal pins 20 of the package 14 will not be projected outwardly from the backside of the cover assembly 12. Accordingly, in transportation of the package 14, the pins 20 can be protected from damage.

According to the present invention, the cover assembly 12 on which the package 14 is mounted is attached to the socket assembly 16 by engaging the first engage portion 58 with the second engage portion 60, and the pins 20 of the package 14 can be contacted with the corresponding contact elements 18 from the side edge 52 towards the side edge 50 one by one. Consequently, the force to be applied to the pin 20 for inserting it into the opening 54 can be minimized, and even if the number of the pins 20 is increased, it is possible to contact the pin 20 with the contact element 18 without applying a specific force thereto.

While there has been described a preferred form of the invention, obviously modifications and variations are possible in light of the above teachings. It is therefore to be understood that within the scope of the appended claims, the invention may be practiced otherwise than as specifically described.

What we claim is:

1. A connector for mounting an integrated circuit package of planer configuration on a printed circuit board, said connector comprising:

a cover assembly with a framework for mounting the integrated circuit package and having a plurality of grooves into which a plurality of pins extended outwardly from the backside of the package are inserted, said framework being hinged to one of side edges of the cover assembly for fixedly securing the package to the cover assembly;

a socket assembly having a plurality of openings therein and a plurality of dielectric protrusions to be received in the grooves in the cover assembly, each of the dielectric protrusions being provided with notches for receiving therein a contact element to connect with the pin of the package;

the cover assembly being provided with a first engaging portion formed from a first central member which has a hollow space in the backside thereof and is arranged along the side edge of the cover assembly opposed to the side edge hinged to the framework and leg portions extending upwardly from both ends of the first central member; and the socket assembly being provided with a second engaging portion being formed from a pair of arms and a second central member to be inserted into the hollow space in the first engaging portion.

2. The connector as claimed in claim 1 in which the integrated circuit package is of a pin grid array type.

3. The connector as claimed in claim 1 in which the latch means are formed from a pair of lock members with an opening provided to the framework and a pair of ears provided to the cover assembly.

* * * * *